|  |  |  |  |
|---|---|---|---|
| United States Patent [19] | | [11] Patent Number: | 4,575,038 |
| Moore | | [45] Date of Patent: | Mar. 11, 1986 |

[54] SPRING CLIP FASTENER FOR MOUNTING OF PRINTED CIRCUIT BOARD COMPONENTS

[75] Inventor: Marvin F. Moore, Carrollton, Tex.

[73] Assignee: Thermalloy Incorporated, Dallas, Tex.

[21] Appl. No.: 626,662

[22] Filed: Jul. 2, 1984

[51] Int. Cl.⁴ ............................................. A47B 97/00
[52] U.S. Cl. ................................. 248/505; 248/316.7
[58] Field of Search ............ 248/505, 510, 501, 316.7; 211/26; 357/81; 165/80 B; 174/16 HF; 338/315, 316; 339/17 CF

[56] References Cited

U.S. PATENT DOCUMENTS

| | | | |
|---|---|---|---|
| 2,382,428 | 8/1945 | Leuvelink | 248/505 |
| 2,541,828 | 2/1951 | Peck | 248/361 |
| 2,870,424 | 1/1959 | Franz | 339/128 X |
| 3,237,905 | 3/1966 | Baker et al. | 248/510 |
| 3,548,927 | 12/1970 | Spurling | 165/80 |
| 4,054,901 | 10/1977 | Edwards et al. | 357/81 |
| 4,333,069 | 6/1982 | Worth | 338/315 |
| 4,403,102 | 9/1983 | Jordan et al. | 174/16 HS |
| 4,508,163 | 4/1985 | McCarthy | 357/81 X |

*Primary Examiner*—J. Franklin Foss
*Attorney, Agent, or Firm*—Kanz, Scherback & Timmons

[57] ABSTRACT

A spring clip fastener (10) is provided for mounting a heat sink (40) and a semiconductor device package (42) to a circuit board (44). Spring clip fastener (10) includes a spring portion (12). Support members (14, 16) extend from the spring portion (12) for supporting the spring portion (12) above the surface of the circuit board (44). A shoulder (18, 20) is contained within the support members (14, 16), such that the spring portion (12) urges the semiconductor device package (42) against the heat sink (40). Feet (30, 32) extend from support members (22, 24) for engaging holes (46, 52) of the circuit board (44). Feet (30, 32) are coated with a solder-promoting material.

5 Claims, 4 Drawing Figures

SPRING CLIP FASTENER FOR MOUNTING OF PRINTED CIRCUIT BOARD COMPONENTS

TECHNICAL FIELD

This invention relates to apparatus for assembly of components on circuit boards and the like, and more particularly to apparatus for assembly and mounting of semiconductor devices and heat sinks for semiconductor devices and the like to printed circuit boards or other mounting substrates.

BACKGROUND ART

Many semiconductor devices generate heat during operation which must be dissipated to avoid damage to the device. In some devices, the heat generated is dissipated sufficiently by the enclosure, header or leads. Other devices may be mounted on heat sinks including bodies of thermally conductive materials such as, for example, copper and aluminum which dissipate the heat generated by the semiconductor devices into the surrounding environment. Such heat sinks may be extruded, machined or include sheet metal bodies having heat dissipating fins.

Numerous mounting and fastening devices have been proposed for mounting heat sinks to printed circuit boards, for example, U.S. Pat. No. 4,388,967 issued to L. Breese on June 21, 1983 and entitled "Solderable Mounting Stakes For Heat Sinks"; U.S. Pat. No. 4,403,102 issued to W. Jordan, et al. on Sept. 6, 1983 and entitled "Heat Sink Mounting"; and U.S. Pat. No. 4,054,901 issued to S. Edwards, et al. on Oct. 18, 1977 and entitled "Index Mounting Unitary Heat Sink Apparatus With Apertured Base". Characteristic of these fastening devices is a structure for attaching the combination of a semiconductor device and a heat sink to a circuit board in which the fastening device is received by holes formed through the circuit board. The fastener can then be soldered to the bottom surface of the printed circuit board in much the same way other components such as, for example, transistors, resistors and capacitors, are electrically connected to the circuit board such as, for example, wave soldering.

A need has arisen for a simple fastener, both in construction and use to accommodate the numerous heat dissipating devices used with semiconductor devices.

DISCLOSURE OF THE INVENTION

In accordance with the present invention, a spring clip fastener is provided for the mounting of heat dissipating devices and semiconductor devices to printed circuit boards.

In accordance with the present invention, a fastener is provided for mounting a heat sink and semiconductor device package to a circuit board. The fastener includes a body. The central portion of the body engages the semiconductor device package. Structure extends from the body on each side of the central portion for retaining the heat sink to the semiconductor device package and for engaging holes in the circuit board. This structure includes a surface generally perpendicular to the surface of the circuit board which is coated with a solder-promoting material.

BRIEF DESCRIPTION OF THE DRAWINGS

For a more complete understanding of the present invention and for advantages thereof, reference is now made to the following Detailed Description taken in conjunction with the accompanying Drawings in which.

DETAILED DESCRIPTION

Figure 1:
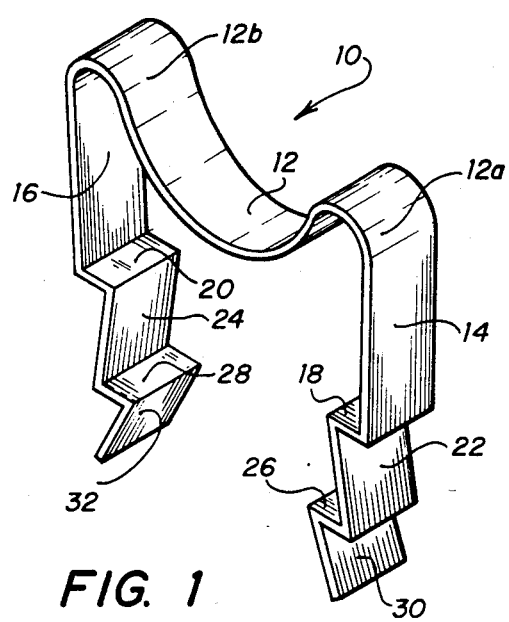
FIG. 1 is a perspective view of the spring clip fastener in accordance with the present invention.
Figure 2:
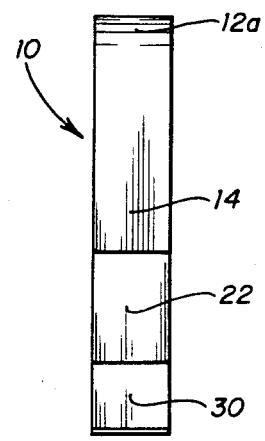
FIG. 2 is a side view of the fastener shown in FIG. 1.

Referring simultaneously to FIGS. 1 and 2, a spring clip fastener in accordance with the present invention is illustrated and is generally identified by the numeral 10. Spring clip fastener 10 comprises a unitary body of material formed from a generally flat metal blank. The flat metal blank is formed to define a centrally disposed, arcuate spring portion 12 whose ends 12a and 12b are formed to extend to support members 14 and 16. Support members 14 and 16 are generally vertically disposed.

Support members 14 and 16 form shoulders 18 and 20, respectively, which are disposed generally perpendicular to support members 14 and 16. Shoulders 18 and 20 are supported by support members 22 and 24, respectively. Attached to the ends of support members 22 and 24 are shoulders 26 and 28, respectively, which are disposed substantially parallel to shoulders 18 and 20. Shoulders 26 and 28 are supported by feet 30 and 32, respectively, which are disposed generally parallel to support members 22 and 24. Spring clip fastener 10 retains a semiconductor device package and heat dissipating device between shoulders 18 and 20 and spring portion 12, such that the semiconductor device package and heat sink are supported above the surface of a circuit board by support members 22 and 24, with feet 30 and 32 extending through holes in the circuit board.

Spring clip fastener 10 may be formed by conventional metal forming techniques from any suitable sheet or ribbon material such as aluminum alloys and steel alloys. The material selected should exhibit sufficient strength and resiliency to permit spring portion 12 to act as a clip to firmly engage the semiconductor device package between spring portion 12 and shoulders 18 and 20 of spring clip fastener 10.

An important aspect of the present invention is that feet 30 and 32 readily accept a solder bond. Feet 30 and 32 are clad with a solderable coating material which promotes the formation of solder bonds such as tin or a tin-lead alloy. The pre-clad material may be applied by conventional pre-tinning or by plating or the like. Such pre-clad is conventionally referred to as "pre-tin" regardless of the composition of the material or the process by which it is applied and the terms "pre-tinned", "pre-tin", "tin-plated", and "tin-coated" are used interchangeably herein to refer to solderable or solder-promoting coatings regardless of the actual composition of the coating or the manner by which the coating is applied. Feet 30 and 32 may be pre-tinned after the spring clip fastener 10 is formed as described above or spring clip fastener 10 may itself be formed from pre-tinned blank stock. Spring clip fastener 10 may be formed by metal stamping using conventional spring steel and the stamped part thereafter tin-plated.

Figure 4:
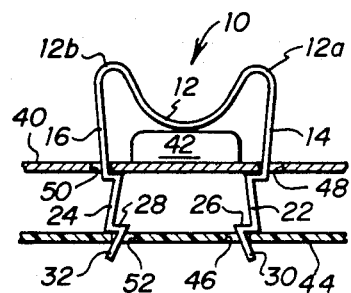
FIG. 4 is a side view partially in section of the fastener, heat dissipating device and semiconductor device package shown in FIG. 3.
Figure 3:
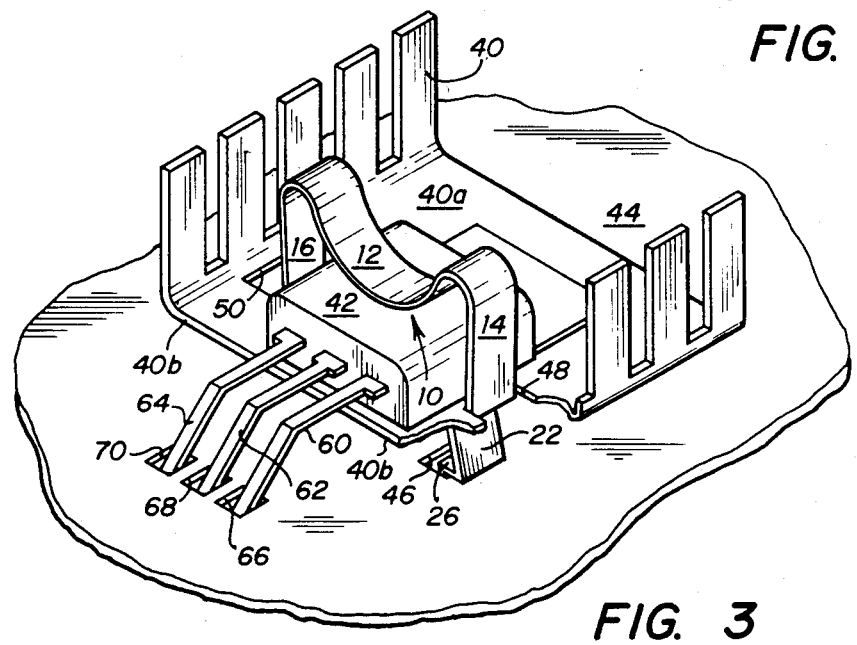
FIG. 3 is a perspective view of the fastener shown in FIG. 1 mounting a heat dissipating device and semiconductor device package to a circuit board.

Referring now to FIGS. 3 and 4, spring clip fastener 10 may be used in connection with a variety of conventional heat sink structures and semiconductor device packages to form a solderable fastener heat sink assembly for mounting the heat sink and semiconductor device package to a circuit board. A typical assembly is illustrated in FIGS. 3 and 4 wherein a heat sink 40 is attached to a semiconductor device package 42 using the present spring clip fastener 10, which in turn is mounted to a circuit board 44. Shoulders 26 and 28 lie parallel to the surface of circuit board 44 for supporting heat sink 40 above the surface of circuit board 44. Spring clip fastener 10 captures semiconductor device package 42 between spring portion 12 and surface 40a of heat sink 40.

Support members 14 and 16 are disposed within apertures 48 and 50 within heat sink 40. Bottom surface 40b of heat sink 40 lies adjacent shoulders 18 and 20. Shoulders 26 and 28 lie on the surface of circuit board 44, such that feet 30 and 32 extend through holes 46 and 52, respectively, in circuit board 44. Feet 30 and 32 are then soldered to the underside of circuit board 44 along with the leads of other components, including semiconductor device package 42. Semiconductor device package 42 includes leads 60, 62 and 64 which extend through holes 66, 68 and 70 respectively in circuit board 44. Support members 22 and 24 allow for mounting of heat sink 40 a predetermined distance above the surface of circuit board 44 to thereby allow for proper air flow around heat sink 40 and the washing of flux and other debris from circuit board 44 after soldering.

As shown in FIGS. 3 and 4, semiconductor device package 42 corresponds to a JEDEC TO-220 plastic power package and is shown for illustrative purposes only, it being understood that other semiconductor device packages can be utilized with the present spring clip fastener 10 as well as other heat sinks.

The fastener of the present invention may also be inserted through holes in the circuit board for mounting the heat sink and semiconductor device assembly or semiconductor device alone without being soldered to the circuit board. The resiliency of the spring and supporting structure is sufficient for mechanical attachment to the circuit board.

It therefore can be seen that the present fastener allows for the mounting of a semiconductor device and heat sink to a circuit board. Since feet 30 and 32 are pre-tinned, the entire assembly may be physically and electrically connected to circuit board 44 in a single operation such as, for example, by passing the assembly through a wave solder operation.

Whereas the present invention has been described with respect to specific embodiments thereof, it will be understood that various changes and modifications will be suggested to one skilled in the art and it is intended to encompass such changes and modifications as fall within the scope of the appended claims.

I claim:

1. Unitary apparatus for assembling a heat sink and a semiconductor device package in intimate mutual contact and securing the assembly to a circuit board, said apparatus comprising:
  (a) body;
  (b) spring means integral with and substantially centrally disposed in said body for engaging said semiconductor device package and urging said semiconductor device package into contact with said heat sink;
  (c) support means extending from said spring means for supporting said spring means and said assembly above the surface of said circuit board;
  (d) first shoulder means integrally formed in said support means and spaced from said spring means for engaging and supporting said heat sink above the surface of said circuit board and for retaining said heat sink in fixed position when said spring means urges said semiconductor device package into contact with said heat sink;
  (e) foot means extending from said support means adapted to be positioned with an aperture in said circuit board; and
  (f) second shoulder means integrally formed in said support means between said foot means and said first shoulder means and spaced from said first shoulder means, said second shoulder means adapted to engage the surface of said circuit board when said foot means is inserted within said aperture and thereby support said assembly in a fixed position spaced from the surface of said circuit board.

2. Apparatus as defined in claim 1 wherein said spring means is arcuate in shape having first and second ends.

3. Apparatus as defined in claim 2 wherein said support means extends from said first and second ends of said spring means.

4. Apparatus as defined in claim 1 wherein said foot means are coated with a solder-promoting material.

5. In combination:
  (a) a semiconductor device package;
  (b) a heat sink;
  (c) a circuit board; and
  (d) unitary fastening means maintaining said heat sink and said semiconductor device package in intimate mutual contact and securing the heat sink and semiconductor device package assembly in a fixed position spaced from the surface of said circuit board, said unitary fastening means comprising:
  (i) an elongated unitary body;
  (ii) spring means integral with and substantially centrally disposed in said body engaging said semiconductor device package and urging said semiconductor device package into contact with said heat sink;
  (iii) support means extending from said spring means and supporting said spring means, said heat sink and said semiconductor device package above the surface of said circuit board;
  (iv) first shoulder means integrally formed in said support means engaging said heat sink and supporting said heat sink above the surface of said circuit board also retaining said heat sink in fixed position with respect to said spring means and said semiconductor device package;
  (v) foot means extending from said support means and secured within an aperture in said circuit board; and
  (vi) second shoulder means integrally formed in said support means between said foot means and said first shoulder means and spaced from said first shoulder means, said second shoulder means engaging the surface of said circuit board thereby supporting said assembly in a fixed position spaced from the surface of said circuit board.

* * * * *

UNITED STATES PATENT AND TRADEMARK OFFICE
CERTIFICATE OF CORRECTION

PATENT NO. : 4,575,038

DATED : March 11, 1986

INVENTOR(S) : Marvin F. Moore

It is certified that error appears in the above-identified patent and that said Letters Patent is hereby corrected as shown below:

In Column 3, line 63, "(a) body;" should read ---(a) a body;---

In Column 4, line 55, "board also" should read ---board and also---

Signed and Sealed this

Tenth Day of June 1986

[SEAL]

Attest:

DONALD J. QUIGG

Attesting Officer

Commissioner of Patents and Trademarks